United States Patent
Lee et al.

(10) Patent No.: US 7,633,152 B2
(45) Date of Patent: Dec. 15, 2009

(54) HEAT DISSIPATION IN INTEGRATED CIRCUITS

(75) Inventors: Cynthia C. Lee, Fogelsville, PA (US); Sidhartha Sen, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 511 days.

(21) Appl. No.: 11/468,901

(22) Filed: Aug. 31, 2006

(65) Prior Publication Data

US 2007/0064398 A1    Mar. 22, 2007

Related U.S. Application Data

(60) Provisional application No. 60/714,214, filed on Sep. 2, 2005.

(51) Int. Cl.
*H01L 23/10* (2006.01)
(52) U.S. Cl. .............. 257/706; 257/707; 257/713; 257/722; 257/723; 257/724; 257/796; 257/E23.051
(58) Field of Classification Search .......... 257/276, 257/625, 675, 706, 707, 712–723, 796, E33.075, 257/E31.131, E23.051, E23.08–E23.113; 361/679.47, 709
See application file for complete search history.

(56) References Cited

U.S. PATENT DOCUMENTS

| | | | | |
|---|---|---|---|---|
| 4,964,458 | A | * | 10/1990 | Flint et al. ................. 165/80.4 |
| 5,621,616 | A | | 4/1997 | Owens et al. |
| 6,046,503 | A | | 4/2000 | Weigand et al. |
| 6,100,199 | A | | 8/2000 | Joshi et al. |
| 6,800,886 | B2 | * | 10/2004 | Awano ....................... 257/276 |

* cited by examiner

*Primary Examiner*—Jasmine J Clark

(57) ABSTRACT

The present invention provides an integrated circuit and method of manufacture therefore. The integrated circuit, in one embodiment, includes heat conducting elements located proximate a plurality of heat generating components located over a substrate. The integrated circuit may further include a heat radiating element comprising one or more fins in thermal communication and physical contact with the heat conducting elements, the heat radiating element configured to dissipate heat generated by the heat generating components away from the integrated circuit.

18 Claims, 3 Drawing Sheets

HEAT DISSIPATION IN INTEGRATED CIRCUITS

CROSS-REFERENCE TO PROVISIONAL APPLICATION

This application claims the benefit of U.S. Provisional Application No. 60,714,214 entitled "HEAT DISSIPATION IN INTEGRATED CIRCUITS" to Cynthia C. Lee, et al., filed on Sep. 2, 2005 which is commonly assigned with the present invention and incorporated herein by reference as if reproduced herein in its entirety.

TECHNICAL FIELD OF THE INVENTION

The present invention is directed, in general, to heat dissipation and, more specifically, to heat dissipation in integrated circuits.

BACKGROUND OF THE INVENTION

During operation, electrical currents conducted throughout the circuitry of an integrated circuit (IC) generate heat that must be dissipated to avoid damage to the IC. Thermal buildup throughout the IC or in localized areas of the IC may reduce the reliability and performance of the IC. Cooling techniques, such as a fan blowing cooling air over the external package of an IC or a heat sink attached to an external package of the IC, have been used to dissipate heat generated by the IC when operating. However, reducing the need to solely rely on external cooling devices is desired.

Accordingly, what is needed in the art is a new technique for dissipating heat in an integrated circuit.

SUMMARY OF THE INVENTION

To address the above-discussed deficiencies of the prior art, the present invention provides an integrated circuit and method of manufacture therefore. The integrated circuit, in one embodiment, includes heat conducting elements located proximate a plurality of heat generating components located over a substrate. The integrated circuit may further include a heat radiating element comprising one or more fins in thermal communication and physical contact with the heat conducting elements, the heat radiating element configured to dissipate heat generated by the heat generating components away from the integrated circuit.

As previously indicated, the present invention further provides a method for manufacturing an integrated circuit. The method in one embodiment, without limitation, includes (1) forming heat conducting elements proximate a plurality of heat generating components located over a substrate, and (2) forming a heat radiating element comprising one or more fins in thermal communication and physical contact with the heat conducting elements, the heat radiating element configured to dissipate heat generated by the heat generating components away from the integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

The present invention is based, at least in part, on the innovative recognition that by forming heat dissipating structures within an integrated circuit (IC), as opposed to solely in the package of the IC, improved cooling of the IC may be achieved. Such heat dissipating structures may be built-in, for example at the chip-level, to dissipate generated heat. In one aspect, the present invention recognizes that by including a heat radiating element comprising one or more fins within the IC itself, heat produced by heat generating components may be effectively dissipated to the surrounding environment. In another aspect, a heat radiating element in thermal communication and physical contact with heat conducting elements within the IC, may be used to effectively dissipate the generated heat to the surrounding environment. The heat conducting elements, in one embodiment, may be thermally conductive interconnects and traces located proximate the heat generating components.

Figure 1:
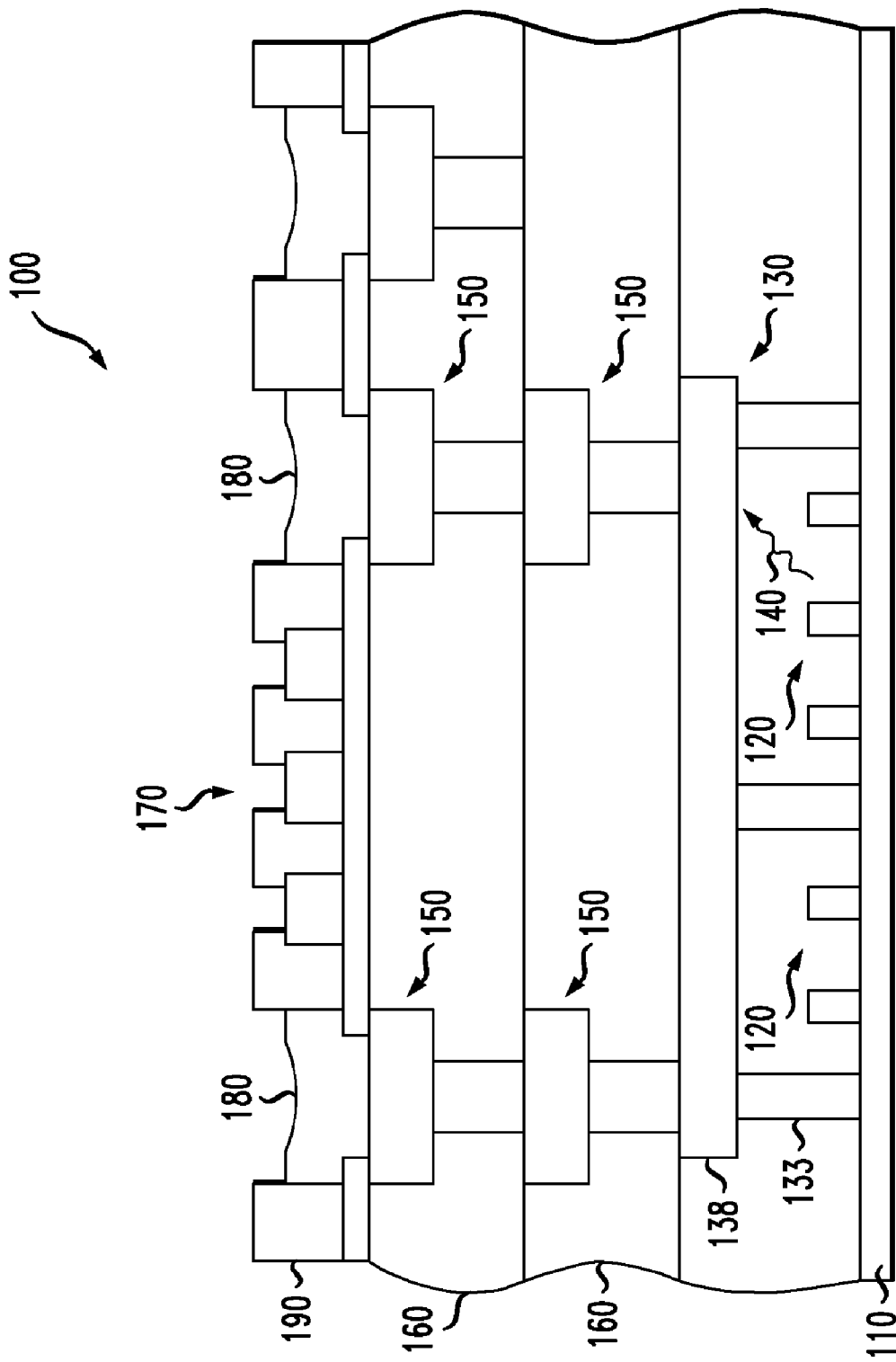
FIG. 1 illustrates a cross-sectional view of an IC manufactured in accordance with the principles of the present invention.

Turning now to FIG. 1, illustrated is a cross-sectional view of an IC 100 manufactured in accordance with the principles of the present invention. The IC 100 of FIG. 1 initially includes a substrate 110. The substrate 110 may be any layer within an IC, including a wafer substrate, epitaxial silicon layer, dielectric layer or any other known or hereafter discovered layer. In the particular embodiment of FIG. 1, however, the substrate 110 is an epitaxial silicon layer.

Positioned over the substrate 110 in the embodiment shown is a plurality of heat generating components 120. The heat generating components 120 are illustrated in FIG. 1 as transistor devices, however, other embodiments exist wherein the heat generating components 120 are other features. For instance, it is envisioned wherein the heat generating components 120 could comprise transistors, capacitors, resistors, diodes, or any combination thereof. Nevertheless, any component capable of generating heat, whether active or passive (e.g., power bussing, metal routing, or metal conductors), might comprise one or more of the heat generating components 120.

Located proximate the heat generating components 120 are a plurality of heat conducting elements 130. The heat conducting elements 130 are configured so as to conduct heat energy 140 that may have been produced by the heat generating components 120 toward an upper surface of the IC 100. As the heat conducting elements 130 conduct the heat energy 140 away from the sensitive circuitry, in this embodiment the heat generating components 120 and other related circuitry, the reliability and performance of the IC 100 may be greatly improved.

In one aspect of the invention, the heat conducting elements 130 comprise a plurality of thermally conductive interconnects 133 and one or more thermally conductive traces 138. It is desirous that the heat conducting elements 130, including the thermally conductive interconnects 133 and thermally conductive traces 138, be positioned in such a location and density so as to conduct the appropriate (e.g., maximum in one embodiment) amount of heat energy 140 away from the heat generating components 120.

The heat conducting elements 130 may comprise any material capable of conducting the heat energy 140 away from the heat generating components 120. In one embodiment, however, the heat conducting elements 130 comprise copper or aluminum, as might already be employed within the IC 100. In alternative embodiments, the heat conducting elements 130 might comprise titanium, tantalum, tungsten, or any combination of the foregoing elements. The present invention should not, however, be limited to any specific material.

The plurality of thermally conductive interconnects 133 and one or more thermally conductive traces 138 might be formed using conventional layer interconnection techniques to be located proximate the heat generating components 120. In one embodiment, the thermally conductive interconnects 133 and the one ore more thermally conductive traces 138 are formed in a same processing step as used to electrically contact the heat generating components 120 and other circuitry located at the same level thereof. Moreover, in certain embodiments the thermally conductive interconnects 133 and the one or more thermally conductive traces 138 are electrically active, such that they have an electrical purpose in addition to their thermal conduction purpose. In other embodiments, however, the thermally conductive interconnects 133 and the one or more thermally conductive traces 138 are electrically inactive, such that they have no electrical purpose.

As is illustrated in FIG. 1, additional heat conducting elements 150 may be located in, on or over dielectric layers 160 located over the heat generating components 120. In this instance, the additional heat conducting elements 150 are configured to conduct the heat energy 140 from the heat conducting elements 130 toward the surface of the IC 100. The additional heat conducting elements 150 may be similar, in virtually all aspects, to the heat conducting elements 130. Those skilled in the art understand how the additional heat conducting elements 150 might be formed.

Positioned over an upper most level (e.g., interconnect metallization level) of the IC 100 and in thermal communication with the heat conducting elements 130 is a heat radiating element 170. The heat radiating element 170 includes one or more fins configured to radiate the heat energy 140 away from the IC 100 into an adjacent environment (e.g., ambient environment).

The heat radiating element 170 may comprise many different materials and stay within the purview of the present invention. Nevertheless, in one embodiment the heat radiating element 170 comprises the same material as bond pads for the IC 100. In this embodiment, the heat radiating element 170 might be formed (e.g., patterned) in the same processing sequence as the bond pads. In an alternative embodiment, the heat radiating element 170 might comprise similar materials as the heat conducting elements 130 might, as well as other related materials.

The heat radiating element 170 may be in thermal communication with the heat conducting elements 130 using various different configurations. For example, in one embodiment the heat radiating element 170 is in physical contact with the heat conducting elements 130 via the additional heat conducting elements 150 and a bond pad 180. The bond pad 180, in this disclosed embodiment, is an electrically inactive bond pad. Nevertheless, other embodiments exist wherein the bond pad 180 is an electrically active bond pad that ultimately has a wire bond (or surface bond as might be used in a flip chip configuration) connected thereto for connection to an external package, including but not limited to a power supply, ground, incoming/outgoing signal, etc. In another embodiment (not shown) the heat radiating element 170 is in direct physical contact with the additional heat conducting elements 150, and thus no bond pad is used. In an even different embodiment (not shown) the heat radiating element 170 is in thermal communication with any heat dissipation structures that would conventional be used in such an IC.

Located above the heat radiating element 170 and bond pads 180 in the embodiment of FIG. 1 is a passivation layer 190. As is illustrated in FIG. 1, the passivation layer 190 exposes at least a portion of an upper surface of the heat radiating element 170, and in this embodiment the bond pads 180, so that the heat energy 140 generated by the heat generating components 130 may be dissipated away from the integrated circuit 100. Without the opening(s) in the passivation layer 190, less efficient dissipation may be achieved. Those skilled in the art appreciate the processes that might be used to form the passivation layer 190 and pattern the openings therein.

Figure 2:
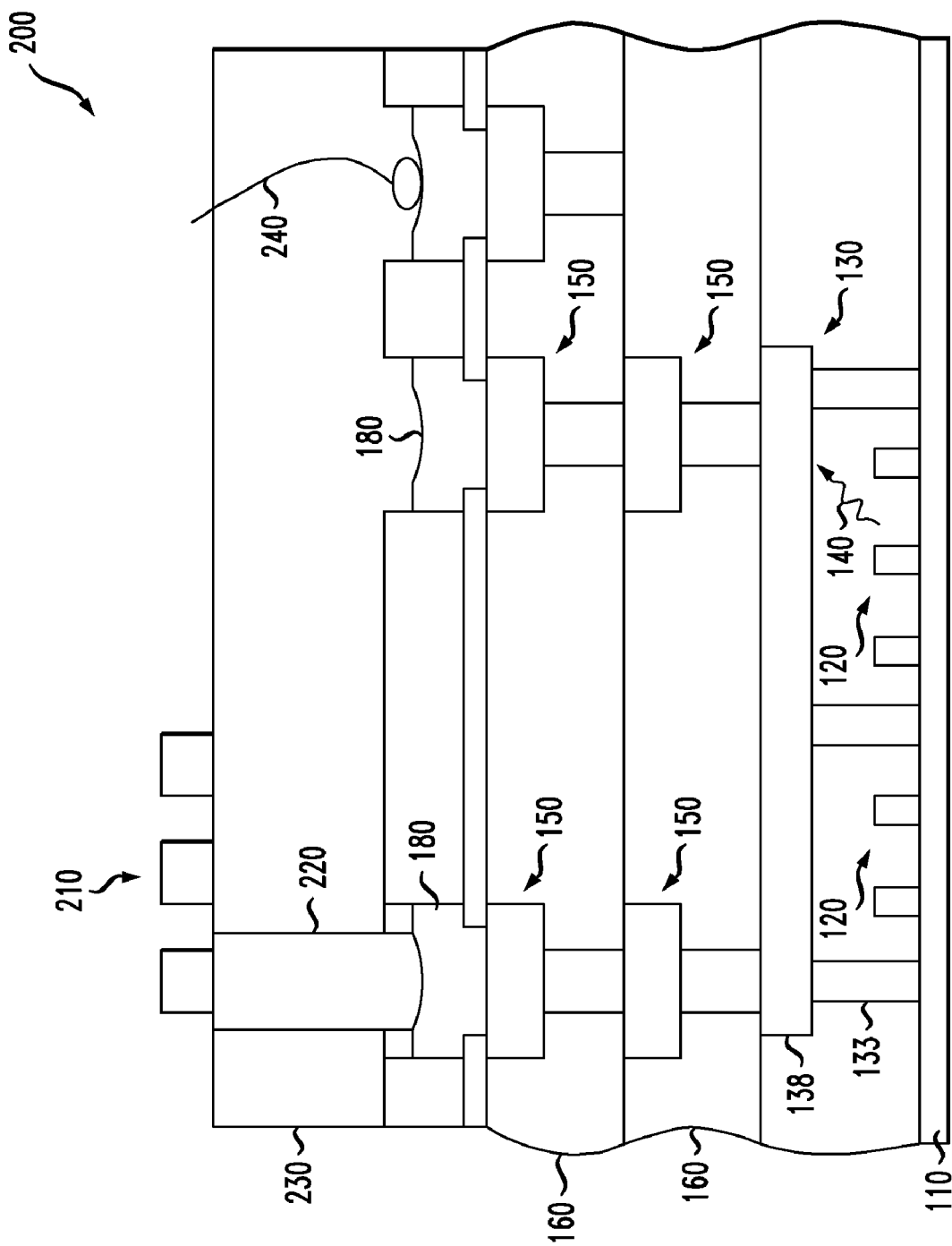
FIG. 2 illustrates a cross-sectional view of an IC manufactured in accordance with the principles of an alternative embodiment of the present invention.

Turning now to FIG. 2, illustrated is a cross-sectional view of an IC 200 manufactured in accordance with the principles of an alternative embodiment of the present invention. The IC 200 of FIG. 2 is substantially similar to the IC 100 of FIG. 1 with the exception of the placement of the heat radiating element 210. Accordingly, like reference numerals indicate like features in the different embodiments of FIGS. 1 and 2.

The heat radiating element 210 of FIG. 2, as compared to the heat radiating element 170 of FIG. 1, is located above the bond pad 180 level. For instance, the heat radiating element 210 of FIG. 2 is positioned in, over or on an outer surface of a packaging layer 230 that at least partially encapsulates the IC 200. The heat radiating element 210 is still in physical contact with the heat conducting elements 130, however, in this embodiment it is in physical contact with the heat conducting elements 130 via the additional heat conducting elements 150, bond pad 180, and a thermally conductive coupler 220. The thermally conductive coupler 220, in the instant embodiment, extends through the packaging layer 230 to provide the physical contact. Accordingly, the embodiment of FIG. 2 thermally conducts the heat energy 140 away from the IC 200, and more specifically away from the packaging layer 230, to an ambient environment. The IC 200 of FIG. 2 further includes a wirebond 240 for accessing an external signal, power supply, ground, etc. through the packaging layer 230.

Figure 3A:
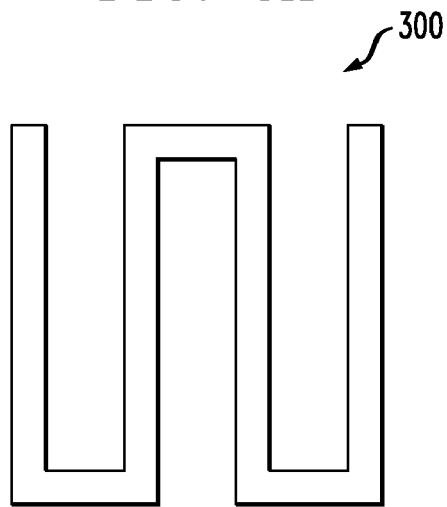
FIGS. 3A thru 3C illustrate top views of exemplary trace geometries for heat radiating elements manufactured in accordance with the principles of the present invention.
Figure 3B:
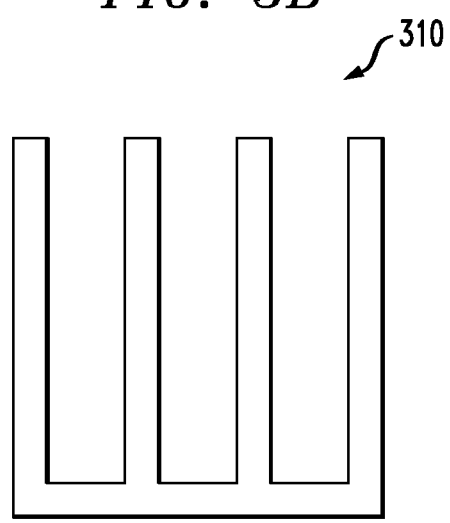
Figure 3C:
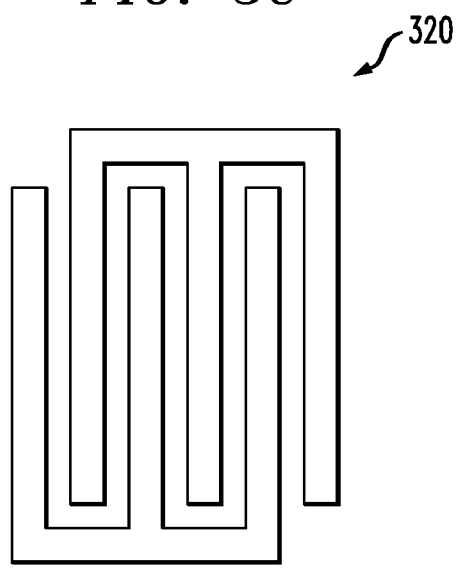

Turning briefly to FIGS. 3A thru 3C, illustrated are top views of exemplary trace geometries for heat radiating elements manufactured in accordance with the principles of the present invention. FIG. 3A depicts a heat radiating element 300 having a serpentine trace geometry. FIG. 3B, on the other hand, depicts the heat radiating element 310 having a comb trace geometry. Likewise, FIG. 3C depicts a heat radiating element 320 having an interleaved, or interdigitated, comb trace geometry. The heat radiating elements 300, 310, 320 of FIGS. 3A thru 3C, as well as many other designs for a heat radiating element, might be used in accordance with the teachings set-forth above with respect to previous FIGS. 2 and 3.

Although the present invention has been described in detail, those skilled in the art should understand that they can make various changes, substitutions and alterations herein without departing from the spirit and scope of the invention in its broadest form.

What is claimed is:

1. An integrated circuit, comprising:
   heat conducting elements located proximate a plurality of heat generating components located over a substrate;
   a heat radiating element comprising one or more fins in thermal communication and physical contact with the heat conducting elements, the heat radiating element configured to dissipate heat generated by the heat generating components away from the integrated circuit; and
   a passivation layer located above the heat radiating element, the passivation layer exposing at least a portion of an upper surface of the heat radiating element.

2. The integrated circuit as recited in claim 1 wherein the heat radiating element includes a single fin configured as a serpent or a comb.

3. The integrated circuit as recited in claim 1 wherein the heat radiating element includes multiple fins configured as interdigitated combs.

4. The integrated circuit as recited in claim 1 wherein active bond pad is in thermal communication and physical contact with the heat conducting elements, and further wherein the heat radiating element physically contacts the active bond pad.

5. The integrated circuit as recited in claim 1 wherein the heat conducting elements are electrically active interconnects or traces.

6. The integrated circuit as recited in claim 1 wherein the heat conducting elements are electrically inactive interconnects or traces.

7. The integrated circuit as recited in claim 1 wherein the heat radiating element comprises a material selected from the group consisting of:
   copper;
   aluminum;
   titantium;
   tantalum; and
   tungsten.

8. The integrated circuit as recited in claim 1 wherein the plurality of heat generating components comprise one or more devices selected from the group consisting of:
   transistors;
   capacitors;
   resistors;
   diodes; or
   any combination thereof.

9. The integrated circuit as recited in claim 1 further including a packaging layer at least partially encapsulating the integrated circuit, wherein the heat radiating element is located on, over or in an outside surface of the packaging layer, and further wherein a thermally conductive coupler extending through the packaging layer causes the heat radiating element to be in thermal communication and physical contact with the heat conducting elements.

10. A method for manufacturing an integrated circuit, comprising:
    forming heat conducting elements proximate a plurality of heat generating components located over a substrate;
    forming a heat radiating element comprising one or more fins in thermal communication and physical contact with the heat conducting elements, the heat radiating element configured to dissipate heat generated by the heat generating components away from the integrated circuit; and
    creating a passivation layer above the heat radiating element, the passivation layer exposing at least a portion of an upper surface of the heat radiating element.

11. The method as recited in claim 10 wherein the heat radiating element includes a single fin configured as a serpent or a comb.

12. The method as recited in claim 10 wherein the heat radiating element includes multiple fins configured as interdigitated combs.

13. The method as recited in claim 10 wherein and active bond pad is in thermal communication and physical contact with the heat conducting elements, and further wherein the heat radiating element physically contacts the active bond pad.

14. The method as recited in claim 10 wherein the heat conducting elements are electrically active interconnects or traces.

15. The method as recited in claim 10 wherein the heat conducting elements are electrically inactive interconnects or traces.

16. The method as recited in claim 10 wherein the heat radiating element comprises a material selected from the group consisting of:
    copper;
    aluminum;
    titantium;
    tantalum; and
    tungsten.

17. The method as recited in claim 10 wherein the plurality of heat generating components comprise one or more devices selected from the group consisting of:
    transistors;
    capacitors;
    resistors;
    diodes; or
    any combination thereof.

18. The method as recited in claim 10 further including at least partially encapsulating the integrated circuit with a packaging layer, wherein the heat radiating element is located on over or in an outside surface of the packaging layer, and further wherein a thermally conductive coupler extending through the packaging layer causes the heat radiating element to be in thermal communication and physical contact with the heat conducting elements.

* * * * *